United States Patent
Jeong et al.

(10) Patent No.: US 12,421,605 B2
(45) Date of Patent: Sep. 23, 2025

(54) METHOD FOR AREAL SELECTIVE FORMING OF THIN FILM

(71) Applicant: EGTM Co., Ltd., Suwon-si (KR)

(72) Inventors: Ju Hwan Jeong, Suwon-si (KR); Hyeon Sik Cho, Suwon-si (KR); Han Bin Lee, Suwon-si (KR); Sun Young Baik, Suwon-si (KR); Woong Jin Choi, Suwon-si (KR); Ha Na Kim, Suwon-si (KR); Myeong Il Kim, Suwon-si (KR); Kyu Ho Cho, Suwon-si (KR)

(73) Assignee: EGTM Co., Ltd., Suwon-si (KR)

( * ) Notice: Subject to any disclaimer, the term of this patent is extended or adjusted under 35 U.S.C. 154(b) by 0 days.

(21) Appl. No.: 18/654,700

(22) Filed: May 3, 2024

(65) Prior Publication Data
US 2024/0368762 A1    Nov. 7, 2024

(30) Foreign Application Priority Data
May 4, 2023 (KR) .......................... 10-2023-0058754

(51) Int. Cl.
  *C23C 16/455*  (2006.01)
  *C23C 16/04*  (2006.01)
  *C23C 16/44*  (2006.01)

(52) U.S. Cl.
  CPC ...... *C23C 16/45553* (2013.01); *C23C 16/042* (2013.01); *C23C 16/4408* (2013.01)

(58) Field of Classification Search
  CPC ............ C23C 16/45553; C23C 16/042; C23C 16/4408; C23C 16/04; C23C 16/405;
  (Continued)

(56) References Cited

U.S. PATENT DOCUMENTS

2021/0040130 A1   2/2021  Lee et al.

FOREIGN PATENT DOCUMENTS

| KR | 10-2021-0017069 A | 2/2021 |
| KR | 10-2021-0075750 A | 6/2021 |

(Continued)

OTHER PUBLICATIONS

Machine Translation, KR-20210075750 (Year: 2021).*
Machine Translation, KR-20220032850 (Year: 2022).*

*Primary Examiner* — Michael G Miller
(74) *Attorney, Agent, or Firm* — ROTHWELL, FIGG, ERNST & MANBECK, P.C.

(57) ABSTRACT

Provided is a method for areal selective forming of a thin film according to an exemplary embodiment of the present disclosure including: a substrate preparation step of supplying and stabilizing a substrate including a growth area and a non-growth area into a chamber; a precursor supply step of supplying a metal precursor compound into the chamber and adsorbing the metal precursor compound to the substrate; a purge step of purging the inside of the chamber; and a thin film formation step of supplying a reaction material into the chamber to react with the metal precursor compound and form a thin film, in which the metal precursor compound is a Group 5 metal precursor compound represented by Chemical Formula 1 below:

[Chemical Formula 1]

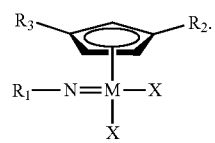

13 Claims, 7 Drawing Sheets

(58) Field of Classification Search
CPC ... C23C 16/45525; C23C 16/52; C23C 16/18;
C23C 16/4481; C23C 16/4482; C23C
16/45527; C23C 16/46; C07F 9/00
See application file for complete search history.

(56) References Cited

FOREIGN PATENT DOCUMENTS

| KR | 20210075750 A | * | 6/2021 |
| KR | 10-2022-0013342 A | | 2/2022 |
| KR | 10-2022-0032850 A | | 3/2022 |
| KR | 20220032850 A | * | 3/2022 |

* cited by examiner

METHOD FOR AREAL SELECTIVE FORMING OF THIN FILM

CROSS-REFERENCE TO RELATED APPLICATIONS

This application claims the priority of Korean Patent Application No. 10-2023-0058754 filed on May 4, 2023, in the Korean Intellectual Property Office, the disclosure of which is incorporated herein by reference in its entirety.

BACKGROUND

Field

The present disclosure relates to a method for areal selective forming of a thin film, and more particularly, to a Group 5 metal compound capable of forming a Group 5 metal-containing thin film with excellent thermal stability, a low growth per cycle (GPC) of the thin film during a deposition process, and a high residue content, and a method for forming a Group 5 metal-containing thin film using the same.

Description of the Related Art

With the development of electronic technology, the demand for miniaturization and lightweighting of electronic devices used in various electronic devices is rapidly increasing. Various physical and chemical deposition methods have been proposed to form fine electronic devices, and various studies have been conducted to manufacture various electronic devices, such as metal thin films, metal oxide thin films, or metal nitride thin films using these deposition methods.

In the manufacturing of semiconductor devices, metal thin films are generally formed using a metal organic chemical vapor deposition (MOCVD) or atomic layer deposition (ALD) process.

Among these, the ALD process is a technology that forms ultra-thin films by exposing metal precursor compounds and reaction materials, which are the raw materials for thin films, to the surface of a substrate in a vacuum state, and has the advantage capable of controlling the fine thickness and forming high-quality thin films. In addition, the ALD process has the advantage of having excellent step coverage due to a self-limiting reaction, and avoiding deterioration of device characteristics by thermal diffusion due to a relatively low-temperature process.

Since a thin film is formed through a surface chemical reaction in the ALD process, the thin film has different surface characteristics depending on a material of the substrate surface to have a difference in initial growth behavior of the thin film. When the thin film is selectively deposited on a specific area using these characteristics, subsequent processes such as etching may be omitted to simplify the process steps, thereby having an advantage of reducing the manufacturing time and production costs. Accordingly, research has been actively conducted on methods of selectively depositing the thin film in a specific area.

SUMMARY

An object to be achieved by the present disclosure is to simplify the process and reduce costs by forming a high-quality thin film areal-selectively on a substrate to omit subsequent processes.

The objects of the present disclosure are not limited to the aforementioned objects, and other objects, which are not mentioned above, will be apparent to those skilled in the art from the following description.

According to an aspect of the present disclosure, there is provided a method for areal selective forming of a thin film according to an exemplary embodiment of the present disclosure including: a substrate preparation step of supplying and stabilizing a substrate including a growth area and a non-growth area into a chamber; a precursor supply step of supplying a metal precursor compound into the chamber and adsorbing the metal precursor compound to the substrate; a purge step of purging the inside of the chamber; and a thin film formation step of supplying a reaction material into the chamber to react with the metal precursor compound and form a thin film, in which the metal precursor compound is a Group 5 metal precursor compound represented by Chemical Formula 1 below.

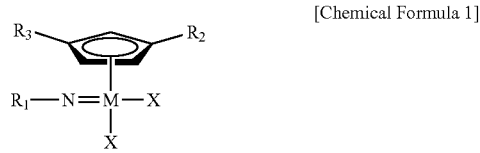

[Chemical Formula 1]

(in Chemical Formula 1, M is any one selected from Group 5 metal elements of niobium (Nb), tantalum (Ta), and vanadium (V), $R_1$, $R_2$, and $R_3$ are each independently selected from a linear alkyl group having 1 to 6 carbon atoms and a branched alkyl group having 3 to 6 carbon atoms, and X is each independently a halogen atom)

According to another exemplary embodiment of the present disclosure, the method may further include a selectivity material supply step of supplying a selectivity material into the chamber to adsorb the selectivity material onto the substrate, between the substrate preparation step and the precursor supply step.

Details of other exemplary embodiments will be included in the detailed description of the disclosure and the accompanying drawings.

According to the exemplary embodiment of the present disclosure, the thin film formed by the method for areal selective forming of the thin film has excellent selectivity between a non-growth area and a growth area to omit subsequent processes such as an etching process after thin film deposition, thereby providing process advantages of simplifying process steps and reducing manufacturing time and production costs.

Further, according to the exemplary embodiment of the present disclosure, in the method for areal selective forming of the thin film, it is possible to minimize leakage current by preventing the thin film from being deposited in an unnecessary area.

The effects according to the present disclosure are not limited by the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE EMBODIMENT

Advantages and features of the present disclosure, and methods for accomplishing the same will be more clearly understood from exemplary embodiments to be described below in detail with reference to the accompanying drawings. However, the present disclosure is not limited to the following exemplary embodiments but may be implemented in various different forms. The exemplary embodiments are provided only to complete disclosure of the present disclosure and to fully provide a person having ordinary skill in the art to which the present disclosure pertains with the category of the disclosure, and the present disclosure will be defined only by the appended claims.

In describing the present disclosure, a detailed description of related known technologies will be omitted if it is determined that they unnecessarily make the gist of the present disclosure unclear. The terms such as "including", "having", and "consist of" used in the present disclosure are generally intended to allow other components to be added unless the terms are used with the term "only". When a component is expressed as singular form, any references to the singular form may include plural form unless expressly stated otherwise.

Components are interpreted to include an ordinary error range even if not expressly stated.

Figure 1:
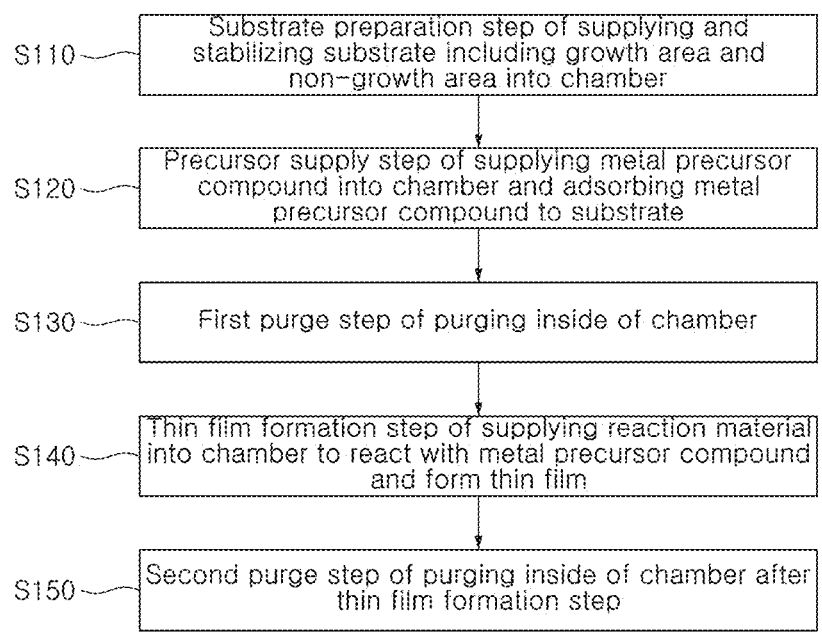
FIG. 1 is a process flowchart for describing a method for areal selective forming of a thin film according to an exemplary embodiment of the present disclosure.

FIG. 1 is a process flowchart for describing a method for areal selective forming of a thin film according to an exemplary embodiment of the present disclosure.

Referring to FIG. 1, the method for areal selective forming of the thin film includes a substrate preparation step (S110) of supplying and stabilizing a substrate including a growth area and a non-growth area into a chamber; a precursor supply step (S120) of supplying a metal precursor compound into the chamber and adsorbing the metal precursor compound to the substrate; a first purge step (S130) of purging the inside of the chamber; a thin film formation step (S140) of supplying a reaction material into the chamber to react with the metal precursor compound and form a thin film; and a second purge step (S150) of purging the inside of the chamber after the thin film formation step.

Hereinafter, each step will be described in detail. For convenience of description, an example in which a thin film is formed by an atomic layer deposition (ALD) method will be described, but the present disclosure is not limited thereto. As another example, the thin film may also be formed using a metal organic chemical vapor deposition (MOCVD) method.

First, the substrate preparation step (S110) is a step of supplying and stabilizing the substrate including the growth area and the non-growth area into the chamber. The substrate including the growth area and the non-growth area is prepared so that the thin film may be formed areal-selectively. The growth area is an area where the growth of the thin film occurs, and the non-growth area is an area where the growth of the thin film is suppressed.

For example, the growth area includes at least one of TiN and NbN. These materials do not suppress the reactivity of the precursor so that the thin film is formed.

For example, the non-growth area includes at least one of Si, SiN, $SiO_2$, SiCO, SiOCN, and SiCN. These materials inhibit the formation of the thin film by inhibiting the reactivity of the precursor.

As such, by using the substrate including the growth area and the non-growth area, the thin film may be deposited in the growth area and the growth of the thin film may be suppressed in the non-growth area, thereby enabling areal selective formation of the thin film.

After supplying the substrate into the chamber, the method includes a step of purging the chamber with inert gas such as argon, nitrogen, or helium to remove impurities in the chamber. In this case, a high-quality thin film may be formed by inhibiting the generation of by-products due to side reactions.

After purging the chamber with the inert gas, the method may include a step of stabilizing the substrate so that the temperature of the substrate reaches a desired level.

For example, the temperature of the substrate may be maintained at a temperature of 50° C. to 700° C. or 100° C. to 600° C. In the range, the metal precursor compound is present in a gas phase, so that a deposition process to be described below may proceed smoothly.

Next, the precursor supply step (S120) is a step of supplying a metal precursor compound into the chamber and adsorbing the metal precursor compound onto the substrate.

For example, the metal precursor compound may be supplied to the substrate by using any one selected from a bubbling method, a vapor phase mass flow controller method, a direct gas injection (DGI) method, a direct liquid injection (DLI) method, a liquid transfer method to be dissolved and transferred in an organic solvent, and the like.

The metal precursor compound supplied as such is adsorbed onto the growth area of the substrate. At this time, the metal precursor compound may be partially adsorbed even onto the non-growth area of the substrate, but may be adsorbed onto the growth area at a high density and only partially adsorbed onto the non-growth area.

If necessary, the metal precursor compound may be supplied with carrier gas or dilution gas. The carrier gas has no reactivity with the metal precursor compound and is lighter than the metal precursor compound to easily transfer the vaporized metal precursor compound to the reaction chamber. The dilution gas has no reactivity with the metal precursor compound, so as not to cause side reactions, and the flow rate thereof may be controlled to easily control the reaction such as a growth rate of the thin film, etc. For example, each of the carrier gas and the dilution gas may be at least one selected from argon (Ar), nitrogen ($N_2$), helium (He), and hydrogen ($H_2$).

For example, the metal precursor compound may be mixed with carrier gas or dilution gas containing at least one selected from argon (Ar), nitrogen ($N_2$), helium (He), and hydrogen ($H_2$) to be transferred onto the substrate by a bubbling method, a direct gas injection method, or a direct liquid injection method.

The metal precursor compound is a Group 5 metal precursor compound represented by Chemical Formula 1.

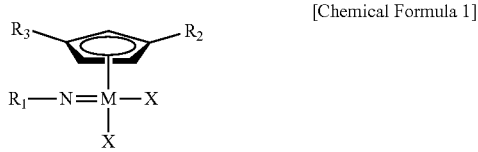

[Chemical Formula 1]

In Chemical Formula 1, M may be any one selected from Group 5 metal elements. For example, M may be any one selected from niobium (Nb), tantalum (Ta), and vanadium (V).

In Chemical Formula 1, $R_1$, $R_2$ and $R_3$ may each independently be selected from a linear alkyl group having 1 to 6 carbon atoms and a branched alkyl group having 3 to 6 carbon atoms. As such, when a cyclopentadiene ligand is substituted with substituents $R_2$ and $R_3$, the binding affinity between the Group 5 metal and the ligand compound may be reduced compared to a Group 5 metal compound containing an unsubstituted cyclopentadiene ligand. Accordingly, the content of unnecessary residues in the thin film formed through the deposition process may be reduced.

Preferably, for example, in Chemical Formula 1, $R_1$ may be a branched alkyl group having 3 to 4 carbon atoms, and $R_2$ and $R_3$ may each be a linear alkyl group having 1 to 6 carbon atoms. In this case, the content of unnecessary residues in the thin film during the deposition process is further reduced, thereby providing a high-quality metal thin film.

In Chemical Formula 1, $R_2$ and $R_3$ may be different from each other. As such, when the substituents $R_2$ and $R_3$ bound to the cyclopentadiene ligand have different asymmetric structures, the precursor compound may be present in a liquid state at room temperature due to a lower melting point, thereby forming a metal thin film with high reproducibility and uniform physical properties.

According to an exemplary embodiment of the present disclosure, in the case of a Group 5 metal compound in which $R_2$ and $R_3$ are substituted with different alkyl groups, a Group 5 metal compound with an asymmetric structure in which one of $R_2$ and $R_3$ is hydrogen has a high vapor pressure, thereby having the advantage of making the deposition process easy.

In addition, under the condition that the sum of the carbon number of $R_2$ and the carbon number of $R_3$ is the same, a Group 5 metal compound with an asymmetric structure where $R_2$ and $R_3$ are different from each other has a higher vapor pressure than a Group 5 metal compound with a symmetric structure where $R_2$ and $R_3$ are the same as each other. Accordingly, it is possible to easily form a high-quality metal thin film through a deposition process.

In Chemical Formula 1, the sum of the carbon numbers of $R_2$ and $R_3$ may be 3 or less. In this case, the Group 5 metal compound may be present in a liquid state at room temperature due to excellent thermal stability and a high vapor pressure, which has the advantage of making the deposition process easy. In Chemical Formula 1, if the sum of the carbon numbers of $R_2$ and $R_3$ is greater than 3, the Group 5 metal compound may be present in a liquid state at room temperature, but may exhibit high viscosity. Accordingly, in terms of ease of the process and forming a high-quality Group 5 metal thin film, the sum of the carbon numbers of $R_2$ and $R_3$ in Chemical Formula 1 may be 3 or less.

In Chemical Formula 1, X may each independently be a halogen element. Specifically, for example, X may each independently be any one selected from fluorine (F), chlorine (Cl), bromine (Br), and iodine (I), and preferably, for example, each X may be chlorine (Cl).

Specifically, for example, the metal precursor compound may be selected from compounds represented by Chemical Formulas 1a, 1b, and 1c below, but is not limited thereto.

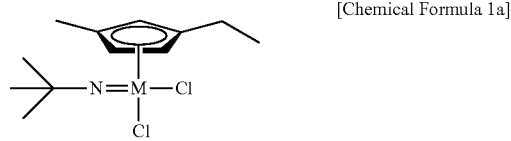

[Chemical Formula 1a]

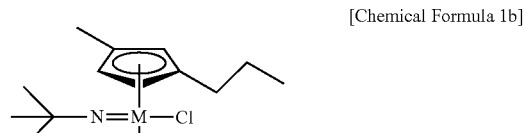

[Chemical Formula 1b]

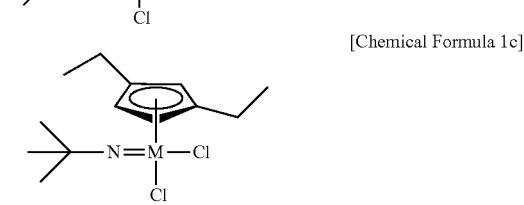

[Chemical Formula 1c]

In Chemical Formulas 1a, 1b, and 1c, M may each independently be any one selected from niobium (Nb), tantalum (Ta), and vanadium (V).

Next, the first purge step (S130) is a step of purging the inside of the chamber with the inert gas. For example, the inert gas may be at least one selected from argon, nitrogen, helium, etc. An unadsorbed precursor and by-products may be removed by purging the inside of the chamber with the inert gas such as argon to form a high-quality thin film.

Next, the thin film formation step (S140) is a step of supplying the reaction material into the chamber to react with the metal precursor compound and form the thin film.

When the reaction material is supplied into the chamber, the substrate is exposed to the reaction material. Accordingly, the reaction material reacts with the metal precursor compound adsorbed onto the growth area to form the thin film.

For example, the reaction material may be at least one reactive gas selected from water vapor ($H_2O$), oxygen ($O_2$), and ozone ($O_3$). The reactive gases may easily react with the precursor compound to form a high-quality thin film.

For example, the above-described steps may be performed in a temperature range of 50° C. to 700° C. and a pressure condition of 10 Torr or less. In this case, a high-quality thin film may be easily formed.

Next, the second purge step (S150) is a step of purging the inside of the chamber after the thin film formation step. In the second purge step, when a thin film with a desired thickness is formed, the inside of the chamber is purged with at least one inert gas selected from argon, nitrogen, helium, etc. to remove unreacted materials and by-products.

According to an exemplary embodiment of the present disclosure, the precursor compound represented by Chemical Formula 1 enables selective deposition by suppressing a nuclear growth on a non-growth area containing Si. Accordingly, subsequent processes such as an etching process after thin film deposition may be omitted to simplify the process steps, thereby providing a process advantage of reducing manufacturing time and production costs. In addition, it is possible to minimize leakage current by preventing the thin film from being deposited in an unnecessary area.

Figure 2:
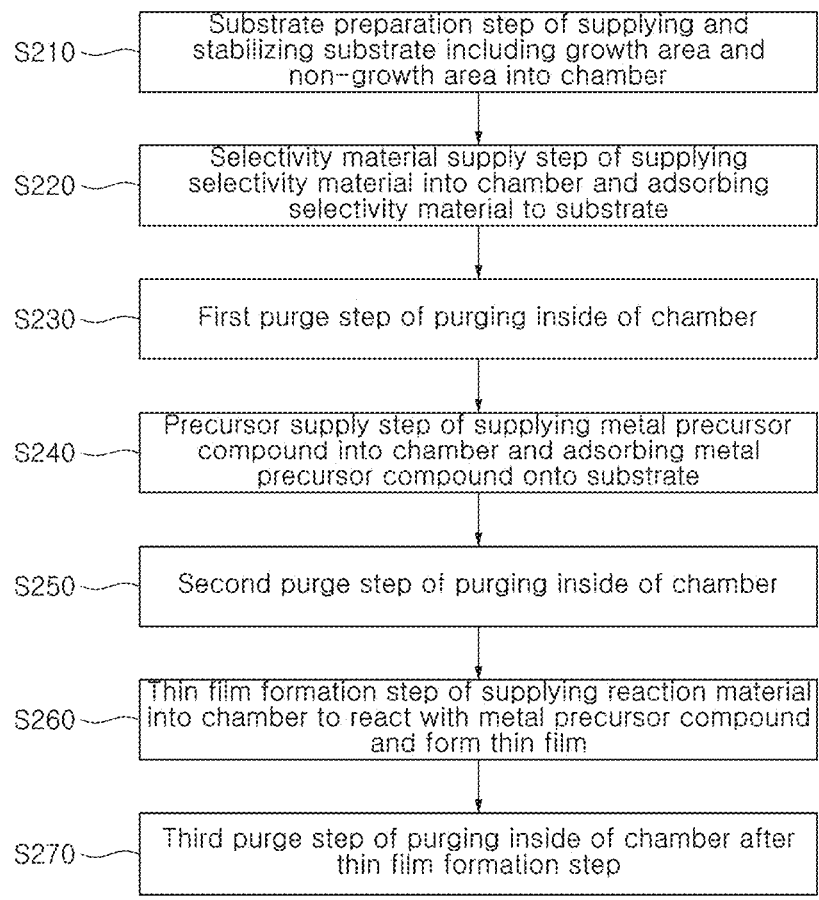
FIG. 2 is a process flowchart for describing a method for areal selective forming of a thin film according to another exemplary embodiment of the present disclosure.

FIG. 2 is a process flowchart for describing a method for areal selective forming of a thin film according to another exemplary embodiment of the present disclosure.

Referring to FIG. 2, the method for areal selective forming of the thin film includes a substrate preparation step (S210) of supplying and stabilizing a substrate including a growth area and a non-growth area into a chamber; a selectivity material supply step (S220) of supplying a selectivity material into the chamber and adsorbing the selectivity material to the substrate; a first purge step (S230) of purging the inside of the chamber; a precursor supply step (S240) of supplying a metal precursor compound into the chamber and adsorbing the metal precursor compound onto the substrate; a second purge step (S250) of purging the inside of the chamber; a thin film formation step (S260) of supplying a reaction material into the chamber to react with the metal precursor compound and form a thin film; and a third purge step (S270) of purging the inside of the chamber after the thin film formation step.

The method for areal selective forming of the thin film according to another exemplary embodiment illustrated in FIG. 2 is substantially the same as the method for areal selective forming of the thin film according to the exemplary embodiment illustrated in FIG. 1, except for further including a selectivity material supply step and a purge step between the substrate preparation step and the precursor supply step. Accordingly, the duplicated description of the same process steps will be omitted.

The method for areal selective forming of the thin film according to another exemplary embodiment includes the selectivity material supply step (S220) after the substrate preparation step (S210).

The selectivity material supply step (S220) is a step of supplying a selectivity material to the chamber and adsorbing the selectivity material onto the substrate. The selectivity material supplied as such is adsorbed onto the non-growth area of the substrate. At this time, the selectivity material is adsorbed at a high density onto the non-growth area of the substrate, and some thereof may also be adsorbed onto the growth area, but a very small portion thereof is adsorbed.

The selectivity material may be a compound represented by Chemical Formula 2.

[Chemical Formula 2]

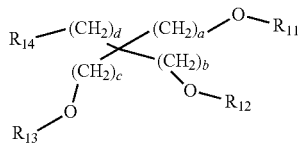

In Chemical Formula 2, a, b, c, and d are each independently an integer of 0 to 8, $R_{11}$ to $R_{13}$ are each independently an alkyl group having 1 to 8 carbon atoms, and $R_{14}$ may be selected from hydrogen, an alkyl group having 1 to 8 carbon atoms, and an alkoxy group having 1 to 8 carbon atoms.

For example, in Chemical Formula 2, a, b, c, and d are each independently an integer of 0 to 1, $R_{11}$ to $R_{13}$ are each independently a linear alkyl group having 1 to 3 carbon atoms, and $R_{14}$ may be hydrogen or a linear alkyl group having 1 to 3 carbon atoms.

The selectivity material has excellent interaction with a non-growth area material such as a material containing at least one of Si, SiN, $SiO_2$, SiCO, SiOCN, and SiCN to be adsorbed onto the non-growth area at a high density.

Since the selectivity material has low reactivity with the metal precursor compound, the selectivity material may effectively inhibit the growth of the thin film in the non-growth area. Accordingly, when the step of supplying the selectivity material is included, the selectivity between the non-growth area and the growth area is further increased, thereby further facilitating the areal selective formation of the thin film.

Preferably, for example, the selectivity material may be a compound represented by Chemical Formula 2a below. In this case, there is an advantage that the selectivity is superior.

[Chemical Formula 2a]

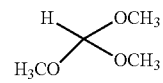

The selectivity material may be supplied in the same manner as the precursor compound described above. For example, the selectivity material may be supplied to the substrate by using any one selected from a bubbling method, a vapor phase mass flow controller method, a direct gas injection (DGI) method, a direct liquid injection (DLI) method, a liquid transfer method to be dissolved and transferred in an organic solvent, and the like.

If necessary, the selectivity material may be supplied with carrier gas or dilution gas. For example, each of the carrier gas and the dilution gas may be at least one selected from argon (Ar), nitrogen ($N_2$), helium (He), and hydrogen ($H_2$).

For example, the selectivity material may be mixed with carrier gas or dilution gas containing at least one selected from argon (Ar), nitrogen ($N_2$), helium (He), and hydrogen ($H_2$) to be transferred onto the substrate by a bubbling method, a direct gas injection method, or a direct liquid injection method.

The method includes the first purge step (S230) after the selectivity material supply step (S220). The first purge step (S230) is a step of purging the inside of the chamber with inert gas. When purging the chamber with the inert gas, an unadsorbed selectivity material and impurities are removed, thereby forming a high-quality thin film.

The precursor supply step (S240), the second purge step (S250), the thin film forming step (S260), and the third purge step (S270) performed subsequently are the same as corresponding steps of the method for forming the thin film according to an exemplary embodiment illustrated in FIG. 1. Accordingly, the duplicated description thereof will be omitted.

The method for areal selective forming of the thin film according to another exemplary embodiment of the present disclosure includes the step of supplying the selectivity material, thereby further inhibiting the growth of the precursor compound in the non-growth area by the selectivity material. Accordingly, the selectivity between the non-growth area and the growth area further significantly increases to omit subsequent processes such as an etching process after thin film deposition, thereby simplifying the process steps, and as a result, it is possible to provide process advantages of reducing manufacturing time and production costs. In addition, it is possible to minimize leakage current by preventing the thin films from being deposited in an unnecessary area.

Hereinafter, a method for areal selective forming of a thin film according to the present disclosure will be described in more detail through the following Embodiments. However, these Embodiments are only presented to aid the understanding of the present disclosure, and the present disclosure is not limited to the following Embodiments.

Embodiment 1

A niobium-containing thin film was formed by using tBuN=Nb(EtMeCp)(Cl)$_{-2}$ represented by Chemical Formula 1a below as a niobium-containing precursor on a substrate containing an area formed of a titanium nitride film (TiN) and an area formed of a silicon nitride film (SiN). A detailed method for forming the thin film was as follows.

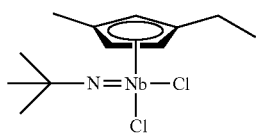

[Chemical Formula 1a]

2 cm×2 cm-sized wafer pieces including an area formed of a titanium nitride film and an area formed of a silicon nitride film were positioned in a load lock using a jig wafer and then transferred to an atomic layer deposition chamber. Thereafter, stabilization was performed while supplying argon so that the temperature of the substrate sufficiently reached a target level. A liquid precursor was vaporized with a vaporizer through a liquid delivery system (LDS) to supply a precursor tBuN=Nb(EtMeCp)(Cl)$_{-2}$. The flow rate of the precursor was supplied at 0.02 g per minute, and carrier gas was supplied at 600 sccm. Ozone was used as reaction gas, and supplied at the flow rate of 600 sccm and the ozone concentration of 170 g/cm$^3$.

A method of selective deposition of a niobium-containing thin film through an ALD process was as follows, and the process below was performed at one cycle.

1) Supplying a precursor tBuN=Nb(EtMeCp)(Cl)$_2$ to a reaction chamber through a liquid delivery system (LDS) method to adsorb the precursor
2) Supplying argon as inert gas into the reaction chamber to remove an unadsorbed precursor and by-products
3) Supplying ozone as reaction gas into the reaction chamber to react with the adsorbed precursor and form a niobium oxide film
4) Supplying the inert gas into the reaction chamber to remove decomposed unreacted materials or by-products Embodiment 2

Embodiment 2 was performed in the same manner as in Embodiment 1 except for supplying a selectivity material. Trimethyl orthoformate (TMOF) was used as a selectivity material. The selectivity material TMOF was supplied by vaporizing liquid TMOF with a vaporizer through a liquid delivery system (LDS) in the same manner as the tBuN=Nb (EtMeCp)(Cl)$_{-2}$ precursor. The flow rate of the selectivity material TMOF was supplied at 0.02 g per minute, and the carrier gas was supplied at 200 sccm.

A method of selective deposition of a niobium-containing thin film through an ALD process was as follows, and the process below was performed at one cycle.

1) Supplying a selectivity material TMOF to a reaction chamber through a liquid delivery system (LDS) method and adsorbing the selectivity material TMOF
2) Supplying argon as inert gas into the reaction chamber to remove an unadsorbed TMOF and by-products
3) Supplying a precursor tBuN=Nb(EtMeCp)(Cl)$_2$ to the reaction chamber through a liquid delivery system (LDS) method to adsorb the precursor
4) Supplying argon as inert gas into the reaction chamber to remove an unadsorbed precursor and by-products
5) Supplying ozone as reaction gas into the reaction chamber to react with the adsorbed precursor and form a niobium oxide film
6) Supplying the inert gas into the reaction chamber to remove decomposed unreacted materials or by-products Comparative Embodiment 1

A niobium-containing thin film was formed in the same manner as in Embodiment 1, except that tert-butylimido tris(diethylamido) niobium (TBTDEN) was used as a precursor.

Comparative Embodiment 2

A niobium-containing thin film was formed in the same manner as in Embodiment 2, except that tert-butylimido tris(diethylamido) niobium (TBTDEN) was used as a precursor.

Experimental Embodiment 1

Figure 3:
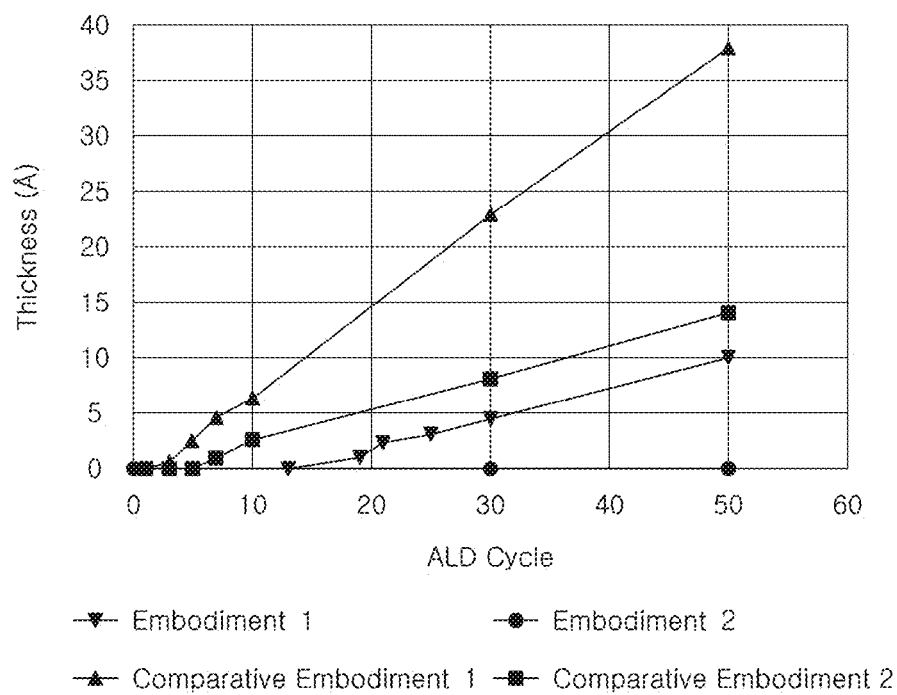
FIG. 3 is a graph showing a thickness change for each cycle in Embodiment 1, Embodiment 2, Comparative Embodiment 1, and Comparative Embodiment 2.

In Embodiment 1, Embodiment 2, Comparative Embodiment 1 and Comparative Embodiment 2, a thickness change according to a cycle of a niobium-containing thin film deposited on a Si substrate was determined. FIG. 3 is a graph showing a thickness change for each cycle in Embodiment 1, Embodiment 2, Comparative Embodiment 1, and Comparative Embodiment 2.

Referring to FIG. 3, it may be seen that when comparing a latency period of the niobium-containing thin film on the Si substrate, the niobium thin film formed with the tBuN=Nb (EtMeCp)Cl$_2$ precursor in Embodiment 1 is longer than the niobium thin film formed with the TBTDEN precursor in Comparative Embodiment 1. This means that the strength of the Nb—Cl bond of tBuN=Nb(EtMeCp)Cl$_2$ is stronger than the Nb—N bond of TBTDEN, and the reactivity is relatively weak, so that the nuclear growth of tBuN=Nb(EtMeCp)Cl$_2$ on the Si substrate is slower than the nuclear growth of TBTDEN.

In addition, it may be seen that when the selectivity material TMOF is used, the nuclear growth is suppressed and thus the latency period is further extended. At this time, it may be seen that when the selectivity material TMOF is used for tBuN=Nb(EtMeCp)Cl$_2$ in Embodiment 2, the latency period increases much more than when the selectivity material TMOF is used for TBTDEN in Comparative Embodiment 2. There may be an effect of desorbing the adsorbed selectivity material by interacting with TBTDEN having relatively high reactivity, but since the reactivity with tBuN=Nb(EtMeCp)Cl$_2$ is relatively low, less interaction occurs, which may be interpreted to exhibit a stronger nuclear growth inhibition effect due to the selectivity material.

As a result, it may be seen that when the niobium thin film is formed on the Si substrate, in the case of using tBuN=Nb(EtMeCp)Cl$_2$ as the precursor, the nuclear growth is suppressed compared to the case of using TBTDEN, thereby enabling selective deposition, and in the case of using the selectivity material, the nuclear growth may be further suppressed to further improve the selectivity.

Experimental Embodiment 2

Figure 4A:
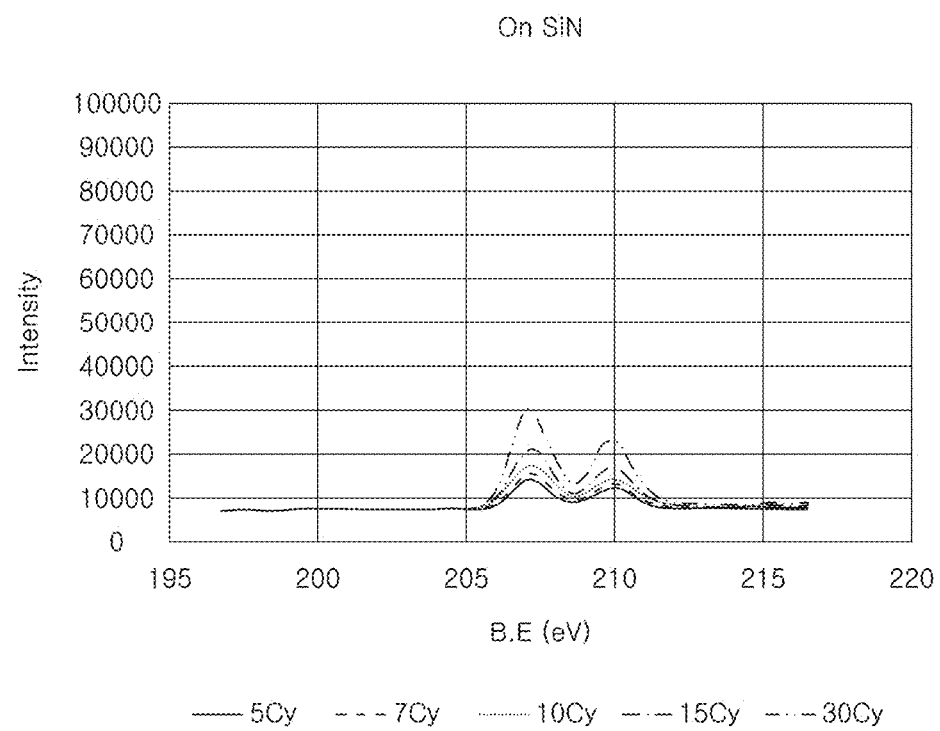
FIG. 4A is a graph showing XPS analysis results of a SiN area of a niobium-containing thin film according to Comparative Embodiment 2.

X-ray photoelectron spectroscopy (XPS) analysis was performed to determine areal selection characteristics of the niobium-containing thin film according to Comparative Embodiment 2, and the deposition was performed by changing a cycle from 3 to 30 cycles. The contents of niobium present in an area containing SiN and an area containing TiN were analyzed through XPS. FIG. 4A is a XPS Nb 3d peak graph of a SiN area of the niobium-containing thin film according to Comparative Embodiment 2, and FIG. 4B is a XPS Nb 3d peak graph of a TiN area of the niobium-containing thin film according to Comparative Embodiment 2.

Figure 4B:
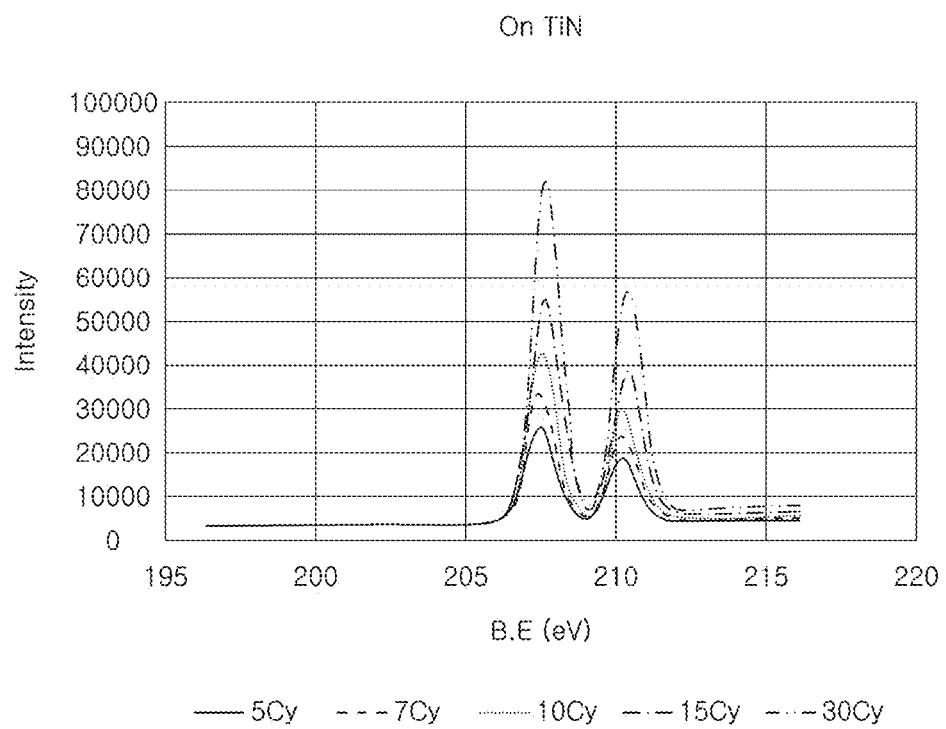
FIG. 4B is a graph showing XPS analysis results of a TiN area of a niobium-containing thin film according to Comparative Embodiment 2.

Referring to FIGS. 4A and 4B together, it may be seen that a change in Nb 3d peak in the SiN area is minimal as the cycle increases, while an Nb 3d peak in the TiN area increases rapidly as the cycle increases. In addition, when comparing the atomic concentration of niobium, it may be seen that there is almost no change in concentration in the SiN area, while the concentration rapidly increases in the TiN area.

As a result, it may be interpreted that this is because the selectivity material TMOF is relatively more adsorbed onto the non-growth area where SiN is formed to delay the nuclear growth of the TBTDEN precursor in a subsequent step. However, in the case of the niobium thin film using the TBTDEN precursor and the selectivity material TMOF, it may be seen that the growth in SiN, the non-growth area, is not completely suppressed, so that the Nb 3d peak increases as the cycle increases.

Table 1 below shows the concentration and selectivity of niobium according to a cycle of the niobium-containing thin film using the selectivity material TMOF and the precursor TBTDEN.

TABLE 1

| Classification | | Cycle | | | | |
|---|---|---|---|---|---|---|
| | | 5 | 7 | 10 | 15 | 30 |
| Niobium con. (%) | SiN area | 1.14 | 1.28 | 1.62 | 2.07 | 3.49 |
| | TiN area | 3.36 | 5.49 | 7.16 | 8.74 | 12.28 |
| | Selectivity(SiN:TiN) | 1:2.95 | 1:4.29 | 1:4.42 | 1:4.22 | 1:3.52 |

Referring to Table 1 above, it may be seen that when the selectivity material is applied to TBTDEN, the selectivity between the SiN area and the TiN area is approximately 1:3 to 1:4.

Experimental Embodiment 3

Figure 5A:
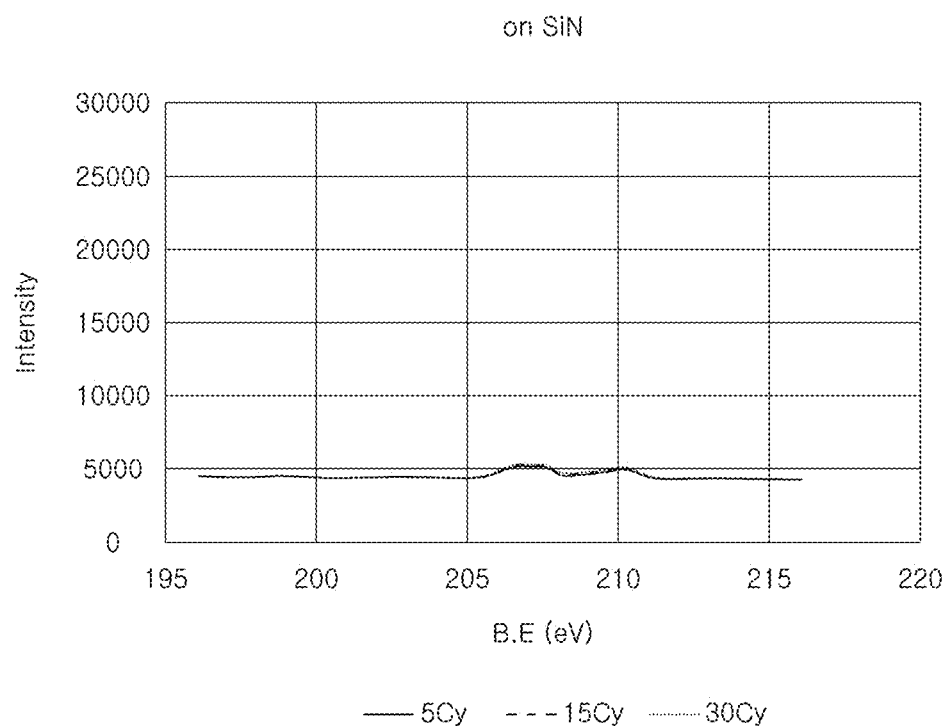
FIG. 5A is a graph showing XPS analysis results of an SiN area of a niobium-containing thin film according to Embodiment 2.

X-ray photoelectron spectroscopy (XPS) analysis was performed to determine areal selection characteristics of the niobium-containing thin film according to Embodiment 2, and the deposition was performed by changing a cycle from 5 to 30 cycles. The contents of niobium present in an area containing SiN and an area containing TiN were analyzed through XPS. FIG. 5A is a XPS Nb 3d peak graph of a SiN area of the niobium-containing thin film according to Embodiment 2, and FIG. 5B is a XPS Nb 3d peak graph of a TiN area of the niobium-containing thin film according to Embodiment 2.

Figure 5B:
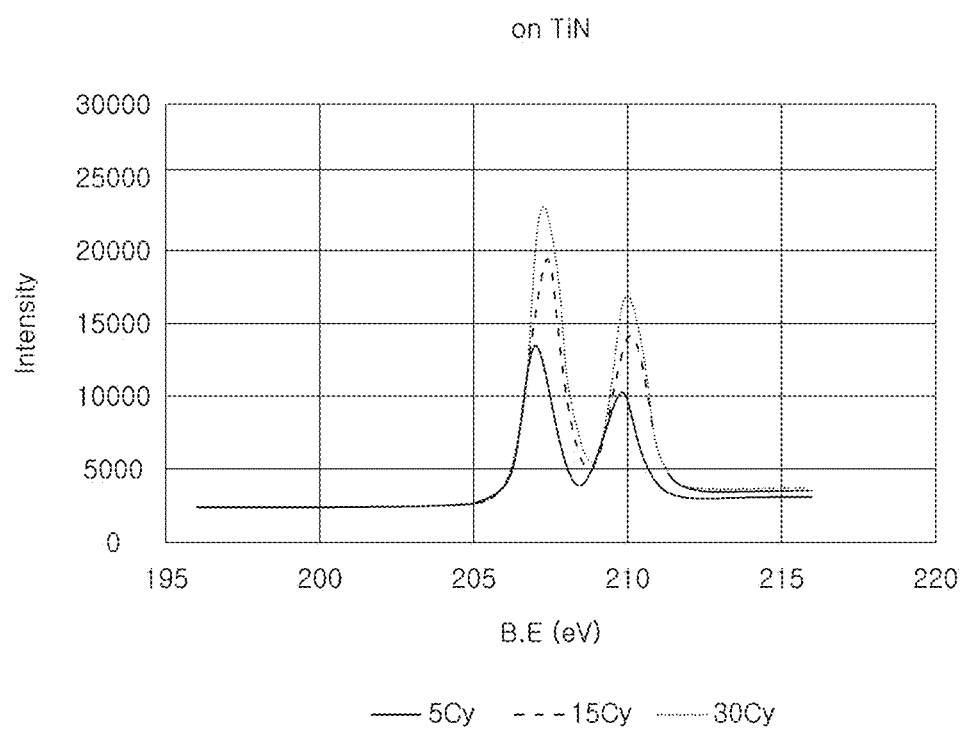
FIG. 5B is a graph showing XPS analysis results of a TiN area of a niobium-containing thin film according to Embodiment 2.

Referring to FIGS. 5A and 5B together, it may be seen that when using the selectivity material TMOF and the precursor tBuN=Nb(EtMeCp)Cl$_2$, the Nb 3d peak on the SiN area is quite low, and there is no change in the Nb 3d peak even when the cycle increases, so that the growth of tBuN=Nb(EtMeCp)Cl$_2$ is almost suppressed. On the other hand, it may be seen that in the TiN area, the Nb 3d peak further increases as the cycle increases, and as a result, it may be seen that the growth in the TiN area has normally occurred. It may be interpreted that the selectivity material TMOF is strongly adsorbed onto the SiN area, and the interaction between tBuN=Nb(EtMeCp)Cl$_2$ and TMOF is relatively weak, so that the growth in the SiN area is completely suppressed.

Table 2 below shows the concentration and selectivity of niobium according to a cycle of the niobium-containing thin film using the selectivity material TMOF and the precursor tBuN=Nb(EtMeCp)Cl$_2$.

TABLE 2

| Classification | | Cycle | | |
|---|---|---|---|---|
| | | 5 | 15 | 30 |
| Niobium con. (%) | SiN substrate | 0.24 | 0.29 | 0.35 |
| | TiN substrate | 2.72 | 4.13 | 5 |
| | Selectivity (SiN:TiN) | 1:11.33 | 1:14.24 | 1:14.29 |

Referring to Table 2 above, it may be seen that when the selectivity material is applied to tBuN=Nb(EtMeCp)Cl$_2$, the selectivity between the SiN area and the TiN area is approximately 1:11 to 1:14, which exhibits much higher selectivity than the case of using TBTDEN.

When summarizing Experimental Embodiments above, when tBuN=Nb(EtMeCp)Cl$_2$ is used as the precursor when forming the niobium thin film, areal selective characteristics are exhibited without using the selectivity material. When the selectivity material is further included, the selectivity further significantly increases and subsequent processes such as an etching process after thin film deposition may be omitted, thereby simplifying the process steps. Further, as a result, it is possible to provide process advantages of reducing manufacturing time and production costs. In addition, it is possible to minimize leakage current by preventing the thin films from being deposited in an unnecessary area.

A method for areal selective forming of a thin film according to various exemplary embodiments of the present disclosure will be described as follows.

The method for areal selective forming of the thin film according to an exemplary embodiment of the present disclosure includes a substrate preparation step of supplying and stabilizing a substrate including a growth area and a non-growth area into a chamber; a precursor supply step of supplying a metal precursor compound into the chamber and adsorbing the metal precursor compound to the substrate; a purge step of purging the inside of the chamber; and a thin film formation step of supplying a reaction material into the chamber to react with the metal precursor compound and form a thin film, in which the metal precursor compound is a Group 5 metal precursor compound represented by Chemical Formula 1 below.

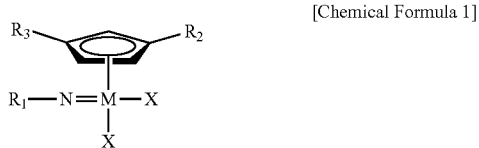

[Chemical Formula 1]

(in Chemical Formula 1, M is any one selected from Group 5 metal elements of niobium (Nb), tantalum (Ta), and vanadium (V), $R_1$, $R_2$, and $R_3$ are each independently selected from a linear alkyl group having 1 to 6 carbon atoms and a branched alkyl group having 3 to 6 carbon atoms, and X is each independently a halogen atom)

According to another feature of the present disclosure, the method may further include a purge step of purging the inside of the chamber after the thin film formation step.

According to yet another feature of the present disclosure, in Chemical Formula 1, $R_1$ may be a branched alkyl group having 3 to 4 carbon atoms, and $R_2$ and $R_3$ may each be a linear alkyl group having 1 to 6 carbon atoms.

According to yet another feature of the present disclosure, in Chemical Formula 1, $R_2$ and $R_3$ may be different from each other, and the sum of the carbon number of $R_2$ and the carbon number of $R_3$ may be 3 or less.

According to yet another feature of the present disclosure, the growth area may include at least one of TiN and NbN.

According to yet another feature of the present disclosure, the non-growth area may include at least one of Si, SiN, $SiO_2$, SiCO, SiOCN, and SiCN.

According to yet another feature of the present disclosure, the reaction material in the thin film formation step may be at least one reactive gas selected from water vapor ($H_2O$), oxygen ($O_2$), and ozone ($O_3$).

According to yet another feature of the present disclosure, the steps may be performed at a temperature of the substrate in the range of 50 to 700° C.

According to yet another feature of the present disclosure, the method may further include a selectivity material supply step of supplying a selectivity material into the chamber to adsorb the selectivity material onto the substrate, between the substrate preparation step and the precursor supply step.

According to yet another feature of the present disclosure, the selectivity material may be a compound represented by Chemical Formula 2 below.

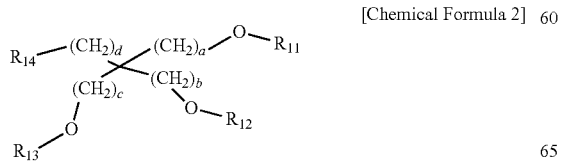

[Chemical Formula 2]

According to yet another feature of the present disclosure, in Chemical Formula 2, a, b, c, and d may each independently be an integer of 0 to 8, $R_5$ to $R_{13}$ may each independently be an alkyl group having 1 to 8 carbon atoms, and $R_{14}$ may be selected from hydrogen, an alkyl group having 1 to 8 carbon atoms, and an alkoxy group having 1 to 8 carbon atoms.

According to yet another feature of the present disclosure, the thin film may be formed by using a metal organic chemical vapor deposition (MOCVD) method or an atomic layer deposition (ALD) method.

According to yet another feature of the present disclosure, the precursor supply step may include a step of transferring the metal precursor compound to the substrate through one method selected from a bubbling method, a vapor phase mass flow controller (MFC) method, a direct gas injection (DGI) method, a direct liquid injection (DLI) method, and an organic solution supply method of dissolving and transferring a metal precursor compound in an organic solvent.

According to yet another feature of the present disclosure, in the precursor supply step, the metal precursor compound may be transferred onto the substrate with carrier gas by a bubbling method, a direct gas injection method, or a direct liquid injection method, and the carrier gas may include at least one selected from argon (Ar), nitrogen ($N_2$), helium (He), and hydrogen ($H_2$).

Although the exemplary embodiments of the present disclosure have been described in detail with reference to the accompanying drawings, the present disclosure is not limited thereto and may be embodied in many different forms without departing from the technical concept of the present disclosure. Accordingly, the various embodiments disclosed in the present disclosure are not intended to limit the technical spirit but describe the present disclosure and the technical spirit of the present disclosure is not limited by the following embodiments. Therefore, it should be understood that the above-described exemplary embodiments are illustrative in all aspects and do not limit the present disclosure. The protective scope of the present disclosure should be construed on the basis of the appended claims, and all the technical ideas in the equivalent scope thereof should be construed as falling within the scope of the present disclosure.

What is claimed is:

1. A method for areal selective forming of a thin film comprising:
   a substrate preparation step of supplying and stabilizing a substrate including a growth area and a non-growth area into a chamber;
   a precursor supply step of supplying a metal precursor compound into the chamber and adsorbing the metal precursor compound to the substrate;
   a purge step of purging an inside of the chamber; and
   a thin film formation step of supplying a reaction material into the chamber to react with the metal precursor compound and form a thin film,
   wherein the metal precursor compound is a Group 5 metal precursor compound represented by Chemical Formula 1 below:

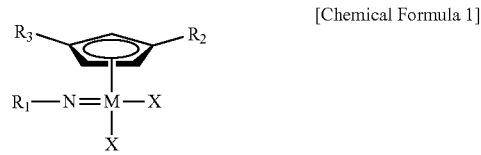

[Chemical Formula 1]

wherein, in the Chemical Formula 1, M is any one selected from Group 5 metal elements of niobium (Nb), tantalum (Ta), and vanadium (V), $R_1$, $R_2$, and $R_3$ are each independently selected from a linear alkyl group having 1 to 6 carbon atoms and a branched alkyl group having 3 to 6 carbon atoms, and X is each independently a halogen atom.

2. The method for areal selective forming of the thin film of claim 1, further comprising:
   a purge step of purging the inside of the chamber after the thin film formation step.

3. The method for areal selective forming of the thin film of claim 1, wherein in the Chemical Formula 1, $R_1$ is a branched alkyl group having 3 to 4 carbon atoms, and $R_2$ and $R_3$ are each a linear alkyl group having 1 to 6 carbon atoms.

4. The method for areal selective forming of the thin film of claim 1, wherein in the Chemical Formula 1, $R_2$ and $R_3$ are different from each other, and
   a sum of the carbon number of $R_2$ and the carbon number of $R_3$ is 3 or less.

5. The method for areal selective forming of the thin film of claim 1, wherein the growth area includes at least one of TiN and NbN.

6. The method for areal selective forming of the thin film of claim 1, wherein the non-growth area includes at least one of Si, SiN, $SiO_2$, SiCO, SiOCN, and SiCN.

7. The method for areal selective forming of the thin film of claim 1, wherein the reaction material in the thin film formation step is at least one reactive gas selected from water vapor ($H_2O$), oxygen ($O_2$), and ozone ($O_3$).

8. The method for areal selective forming of the thin film of claim 1, wherein the steps are performed at a temperature of the substrate in the range of 50 to 700° C.

9. The method for areal selective forming of the thin film of claim 1, further comprising:
   a selectivity material supply step of supplying a selectivity material into the chamber to adsorb the selectivity material onto the substrate, between the substrate preparation step and the precursor supply step.

10. The method for areal selective forming of the thin film of claim 9, wherein the selectivity material is a compound represented by Chemical Formula 2 below:

[Chemical Formula 2]

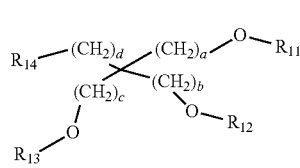

wherein, in the Chemical Formula 2, a, b, c, and d are each independently an integer of 0 to 8, $R_{11}$ to $R_{13}$ are each independently an alkyl group having 1 to 8 carbon atoms, and $R_{14}$ is selected from hydrogen, an alkyl group having 1 to 8 carbon atoms, and an alkoxy group having 1 to 8 carbon atoms.

11. The method for areal selective forming of the thin film of claim 1, wherein the thin film is formed by using a metal organic chemical vapor deposition (MOCVD) method or an atomic layer deposition (ALD) method.

12. The method for areal selective forming of the thin film of claim 1, wherein the precursor supply step includes a step of transferring the metal precursor compound to the substrate through one method selected from a bubbling method, a vapor phase mass flow controller (MFC) method, a direct gas injection (DGI) method, a direct liquid injection (DLI) method, and an organic solution supply method of dissolving and transferring the metal precursor compound in an organic solvent.

13. The method for areal selective forming of the thin film of claim 12, wherein in the precursor supply step, the metal precursor compound is transferred onto the substrate with carrier gas by the bubbling method, the direct gas injection method, or the direct liquid injection method, and
   the carrier gas includes at least one selected from argon (Ar), nitrogen ($N_2$), helium (He), and hydrogen ($H_2$).

* * * * *